United States Patent
Ye et al.

(10) Patent No.: US 9,588,152 B2
(45) Date of Patent: Mar. 7, 2017

(54) DIGITAL SIGNAL PROCESSING METHOD FOR MEASUREMENT OF AC VOLTAGE WITH POWER CONVERTERS AT LIGHT LOAD OPERATION

(71) Applicant: Flextronics AP, LLC, Broomfield, CO (US)

(72) Inventors: Zhen Z. Ye, Garland, TX (US); Xiangping Xu, Garland, TX (US)

(73) Assignee: Flextronics AP, LLC, Broomfield, CO (US)

( * ) Notice: Subject to any disclaimer, the term of this patent is extended or adjusted under 35 U.S.C. 154(b) by 994 days.

(21) Appl. No.: 13/737,739

(22) Filed: Jan. 9, 2013

(65) Prior Publication Data

US 2014/0195182 A1    Jul. 10, 2014

(51) Int. Cl.
*G01R 19/25* (2006.01)
*G01R 19/02* (2006.01)
*G01R 19/165* (2006.01)

(52) U.S. Cl.
CPC ........ *G01R 19/02* (2013.01); *G01R 19/16576* (2013.01)

(58) Field of Classification Search
USPC .......................................................... 702/64
See application file for complete search history.

(56) References Cited

U.S. PATENT DOCUMENTS

| | | | |
|---|---|---|---|
| 6,507,177 B2 | 1/2003 | Flock et al. | |
| 6,621,309 B2 | 9/2003 | Roder et al. | |
| 6,882,121 B2 | 4/2005 | Herke et al. | |
| 6,975,083 B2 | 12/2005 | Flock | |
| 7,006,761 B2 | 2/2006 | Herke | |
| 7,170,270 B2 | 1/2007 | Herke | |
| 2007/0086224 A1 | 4/2007 | Phadke et al. | |
| 2012/0224401 A1 | 9/2012 | Phadke | |
| 2012/0310569 A1* | 12/2012 | Fan | G01R 23/15 702/64 |

OTHER PUBLICATIONS

Operational Amplifiers: Theory and Practice., Second Edition, Version 1.8.1, James K. Oberge and Kent H. Lundberg, Massachusetts Institute of Technology, Apr. 19, 2007.

(Continued)

*Primary Examiner* — Tung Lau
(74) *Attorney, Agent, or Firm* — Haverstock & Owens LLP

(57) ABSTRACT

An observation is made that the peak voltage value for a rectified AC voltage signal is substantially the same from cycle to cycle. Using this observation, a method of measuring an AC voltage is used to determine a more accurate RMS voltage value under light load conditions. The method includes rectifying the AC voltage signal to form a rectified signal, sampling the rectified signal to obtain a set of sampled values for each half-cycle of the AC voltage signal, searching the sampled values for each half-cycle to determine a local minimum value for each half-cycle, searching the sampled values following the local minimum value to determine a local maximum value for each half-cycle, and calculating a root mean square value from the local maximum value for each half-cycle thereby determining the root mean square value for each half-cycle of the AC voltage signal.

9 Claims, 8 Drawing Sheets

(56) References Cited

OTHER PUBLICATIONS

"8 Pin Continuous Conduction Mode (CCM) PFC Controller", www.ti.com., revised Dec. 2007, Texas Instruments Application Report SLUS828B, 49 pages.
"UCC28070 Implement Bridgeless Power Factor Correction (PFC) Pre-Regulator Design", Texas Instruments Application Report, SLUA517, Jul. 2009, 12 pages.

* cited by examiner

Intermediate and Heavy Load    Light Load

Case #1 Voltage Sensing Waveform at Light Load

Case #2 Voltage Sensing Waveform at Light Load

Case #1 Voltage Sensing Waveform at Light Load

Case #2 Voltage Sensing Waveform at Light Load

Case #1 Voltage Sensing Waveform at Light Load

Case #2 Voltage Sensing Waveform at Light Load

Case #1 Voltage Sensing Waveform at Light Load

Case #2 Voltage Sensing Waveform at Light Load

DIGITAL SIGNAL PROCESSING METHOD FOR MEASUREMENT OF AC VOLTAGE WITH POWER CONVERTERS AT LIGHT LOAD OPERATION

FIELD OF THE INVENTION

The present invention is generally directed to the field of measuring AC voltage values. More specifically, the present invention is directed to measuring an AC voltage, which can be associated with power converters such as AC/DC switching mode power supplies, inverters, or uninterruptible power supplies, at light load operation conditions.

BACKGROUND OF THE INVENTION

Knowing a voltage value is a common circuit requirement. For DC voltages, measuring the DC voltage value is straightforward as the value is constant. For AC voltages, the instantaneous value varies with time. However, it is still meaningful to know the average voltage over time, which can be calculated by taking the simple average of the voltage at each instant in the AC voltage waveform or, equivalently, the root mean squared (RMS) of the AC voltage. RMS is a statistical measure of the magnitude of a varying quantity. It is especially useful when the values are positive and negative, e.g. sinusoidal. The RMS value of a set of values, or a continuous-time waveform, is the square root of the arithmetic mean of the squares of the original values, or the square of the function that defines the continuous waveform.

Various conventional sensing circuits are used to measure an AC voltage, where the RMS value of the AC voltage may range from tens to hundreds of volts or more. FIG. 1 illustrates a conventional sensing circuit for measuring an AC voltage. The sensing circuit includes diodes D1 and D2, resistors R1, R2 and R3 for scaling high AC voltage down to low AC voltage, and capacitor C1. An AC voltage is provided to the diodes D1 and D2 and the purpose of the sensing circuit is to output a full-wave rectified voltage signal. FIG. 2 illustrates another conventional sensing circuit for measuring an AC voltage. The sensing circuit of FIG. 2 is similar to the circuit of FIG. 1 with the addition of an amplifier to reduce load impact. FIG. 3 illustrates yet another conventional sensing circuit for measuring an AC voltage. The sensing circuit of FIG. 3 includes diodes D1, D2, D3 and D4, resistors R1, R2, R3 and R4, capacitors C1 and C2, and an amplifier.

FIG. 4 illustrates exemplary voltage waveforms corresponding to the conventional sensing circuits. The top waveforms 2 and 4 show an exemplary AC voltage signal Vin. The middle waveforms 6 and 8 show rectified waveforms |Vin| of the input AC voltage signal. The bottom waveforms 10 and 12 show squared waveforms |Vin|² of the rectified waveforms 6 and 8, respectively. Waveforms 2, 6 and 10 correspond to intermediate and heavy load conditions. Waveforms 4, 8 and 12 correspond to light load conditions. At intermediate and heavy load conditions, full-wave rectification is fully feasible, as shown in waveforms 6 and 10. In the case of digital measurement, the RMS voltage is determined by sampling the rectified waveform 6 according to a sampling rate, such as sampling points 14, 16, 18, 20, 22 and 24, by an analog-to-digital converter, which can be an ASIC chip or can be embedded in a digital signal controller (DSC), a digital signal processor (DSP) or a microcontroller (MCU), and calculating the square of the sampled voltage values and the RMS as the square root of the average of the squared voltage values over a period of time, such as a half-cycle T/2. However, at light load conditions, the rectified waveform |Vin| is distorted, as shown in waveform 8 where the voltage does not transit to zero. In fact, the voltage remains significantly above zero volts. The distorted rectified waveform |Vin| results in a distorted squared waveform |Vin|², as shown in waveform 12. In order to measure a correct RMS voltage value using the sampling method, the rectified voltage waveform 8 should ideally be a full-wave rectified waveform similar to that of waveform 6. However, current methods of determining the RMS voltage assume full-wave rectified signals, even under light load conditions, and utilize sample values regardless of the distortion of the rectified and squared voltage waveforms.

A cause of the distorted rectified voltage waveform is the non-ideal nature of the diodes in the sensing circuit. For intermediate and heavy load conditions, there is sufficient current through the diodes for them to function properly. However, for light load conditions, the current through the diodes is too small for the diodes to function properly, resulting in the distorted rectified waveform. Due to the distorted rectified waveform, and the resulting distorted squared waveform, the measurement accuracy of the AC voltage is no longer guaranteed to be precise under light load conditions. In conventional sensing circuits, the RMS voltage value calculated using the sampling method for light load conditions is greater than the actual RMS voltage value. Additionally, the functionality of the under voltage latch off, which is common in server or telecommunication power supplies and which stops power supplies from normal operation due to the RMS value of the AC voltage being lower than certain thresholds, becomes unreliable under light load conditions.

SUMMARY OF THE INVENTION

An observation is made that the peak voltage value for a rectified AC voltage signal is substantially the same from cycle to cycle. Using this observation, a method of measuring an AC voltage is used to determine a more accurate RMS voltage value under light load conditions.

In an aspect, a method of measuring an AC voltage signal under light load conditions is disclosed. The method includes rectifying the AC voltage signal to form a rectified signal and sampling the rectified signal to obtain a set of sampled values for each half-cycle of the AC voltage signal. The method also includes searching the sampled values for each half-cycle to determine a local minimum value for each half-cycle. The method also includes searching the sampled values following the local minimum value to determine a local maximum value for each half-cycle. The method also includes calculating a root mean square value from the local maximum value for each half-cycle thereby determining the root mean square value for each half-cycle of the AC voltage signal.

In some embodiments, the method also includes setting a sensing voltage threshold value, comparing the sampled values to the sensing voltage threshold value, and if one of the sampled value is equal to or less than the sensing voltage threshold value, then searching sampled values following the one sampled value to determine the local minimum value for each half-cycle. In some embodiments, setting the sensing voltage threshold value includes passing the rectified signal through a low-pass filter and setting the sensing voltage threshold value as an output of the filter. In some embodiments, the method also includes scaling the rectified signal prior to sampling. In this embodiment, calculating the root mean square value can include re-scaling the local maximum value. In some embodiments, the method also includes filtering the determined local maximum value for noise prior to calculating the root means square value. In this embodiment, filtering the determined local maximum value can include averaging the local maximum value of a current half-cycle with one or more filtered local maximum values from one or more preceding half-cycles. Also in this embodiment, calculating the root mean square can include applying a linear interpolation function to the filtered local maximum value. In some embodiments, calculating the root mean square includes applying a linear interpolation function to the local maximum value.

In another aspect, another method of measuring an AC voltage signal under light load conditions is disclosed. The method includes rectifying the AC voltage signal to form a rectified signal and sampling the rectified signal to obtain a set of sampled values for each half-cycle of the AC voltage signal. The method also includes searching the sampled values to determine a local maximum value for each half-cycle. The method also includes calculating a root mean square value from the local maximum value for each half-cycle thereby determining the root mean square value for each half-cycle of the AC voltage signal.

In some embodiments, the method also includes setting a sensing voltage threshold value, comparing the sampled values to the sensing voltage threshold value, and if one of the sampled value is equal to or less than the sensing voltage threshold value, then searching sampled values following the one sampled value to determine the local maximum value for each half-cycle. In this embodiment, setting the sensing voltage threshold value can include passing the rectified signal through a low-pass filter and setting the sensing voltage threshold value as an output of the filter. In some embodiments, the method also includes setting a sensing voltage threshold value, comparing the sampled values to the sensing voltage threshold value, and if one of the sampled value is equal to or greater than the sensing voltage threshold value, then searching sampled values following the one sampled value to determine the local maximum value for each half-cycle. In this embodiment, setting the sensing voltage threshold value can include passing the rectified signal through a low-pass filter and setting the sensing voltage threshold value as an output of the filter. In some embodiments, the method also includes scaling the rectified signal prior to sampling. In this embodiment, calculating the root mean square value can include re-scaling the local maximum value. In some embodiments, the method also includes filtering the determined local maximum value for noise prior to calculating the root means square value. In this embodiment, filtering the determined local maximum value can include averaging the local maximum value of a current half-cycle with one or more filtered local maximum values from one or more preceding half-cycles. Also in this embodiment, calculating the root mean square can include applying a linear interpolation function to the filtered local maximum value. In some embodiments, calculating the root mean square includes applying a linear interpolation function to the local maximum value.

In yet another aspect, an apparatus for measuring an AC voltage signal under light load conditions is disclosed. The apparatus includes means for rectifying the AC voltage signal to form a rectified signal and means for sampling the rectified signal to obtain a set of sampled values for each half-cycle of the AC voltage signal. The apparatus also includes means for searching the sampled values for each half-cycle to determine a local minimum value for each half-cycle. The apparatus also includes means for searching the sampled values following the local minimum value to determine a local maximum value for each half-cycle. The apparatus also includes means for calculating a root mean square value from the local maximum value for each half-cycle thereby determining the root mean square value for each half-cycle of the AC voltage signal.

In some embodiments, the apparatus also includes means for setting a sensing voltage threshold value, means for comparing the sampled values to the sensing voltage threshold value, and means for searching the sampled values following the local minimum value searches sampled values following the one sampled value to determine the local minimum value for each half-cycle if one of the sampled value is equal to or less than the sensing voltage threshold value. In this embodiment, the means for setting the sensing voltage threshold value can include means for passing the rectified signal through a low-pass filter and means for setting the sensing voltage threshold value as an output of the filter. In some embodiments, the apparatus also include means for scaling the rectified signal prior to sampling. In this embodiment, the means for calculating the root mean square value can include means for re-scaling the local maximum value. In some embodiments, the apparatus also includes means for filtering the determined local maximum value for noise prior to calculating the root means square value. In this embodiment, the means for filtering the determined local maximum value can include means for averaging the local maximum value of a current half-cycle with one or more filtered local maximum values from one or more preceding half-cycles. Also in this embodiment, the means for calculating the root mean square can include means for applying a linear interpolation function to the filtered local maximum value. In some embodiments, the means for calculating the root mean square includes means for applying a linear interpolation function to the local maximum value.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

Figure 9:
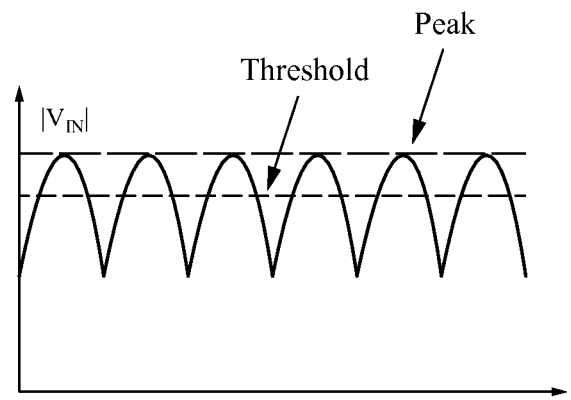
FIG. 9 illustrates an exemplary sensing voltage threshold value set in relation to the distorted rectified waveform |Vin| of FIG. 6.

13 illustrates an exemplary method of determining the local maximum as applied to the distorted rectified waveform |Vin| of FIG. 9.

Figure 14:
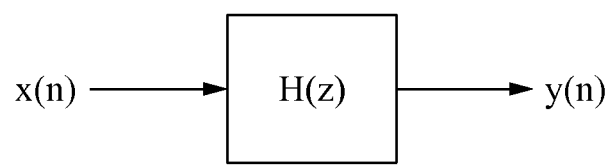

FIG. 14 illustrates a conceptual procedure for filtering the detected local maximum according to an embodiment.

Figure 15:
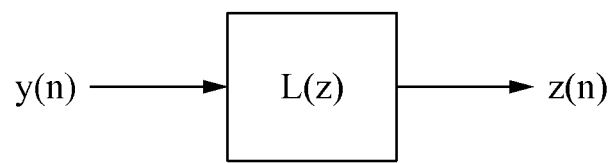

FIG. 15 illustrates a conceptual procedure for converting the filtered local maximum according to an embodiment.

DETAILED DESCRIPTION OF THE EMBODIMENTS

Embodiments of the present application are directed to a system and method of measuring an AC voltage. Those of ordinary skill in the art will realize that the following detailed description of the system and method is illustrative only and is not intended to be in any way limiting. Other embodiments of the system and method will readily suggest themselves to such skilled persons having the benefit of this disclosure.

Reference will now be made in detail to implementations of the system and method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to a system and method of measuring an AC voltage and determining a corresponding RMS value at light load conditions. As used herein, "light load conditions" refers to 0% to 10% of rated load versus intermediate load, which is from greater than 10% to 75%, and heavy load, which is greater than 75% load.

Figure 1:
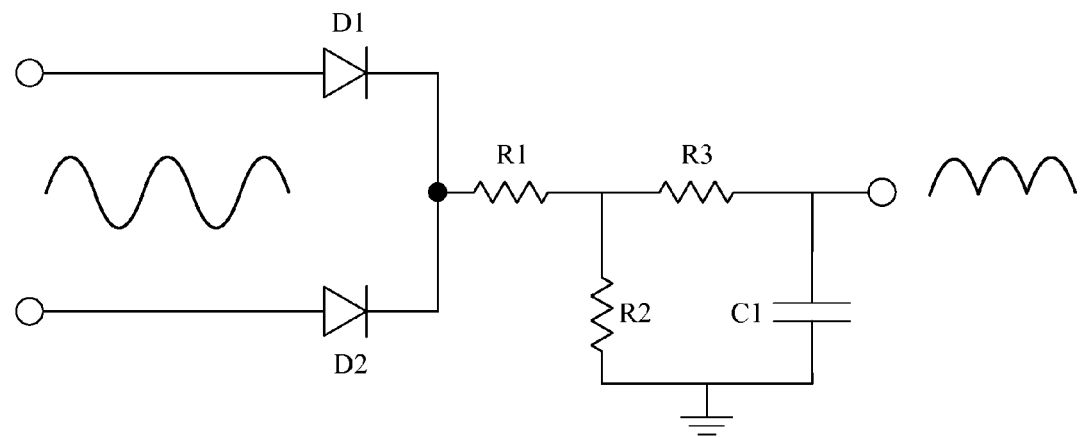
FIG. 1 illustrates a conventional sensing circuit for measuring an AC voltage.
Figure 2:
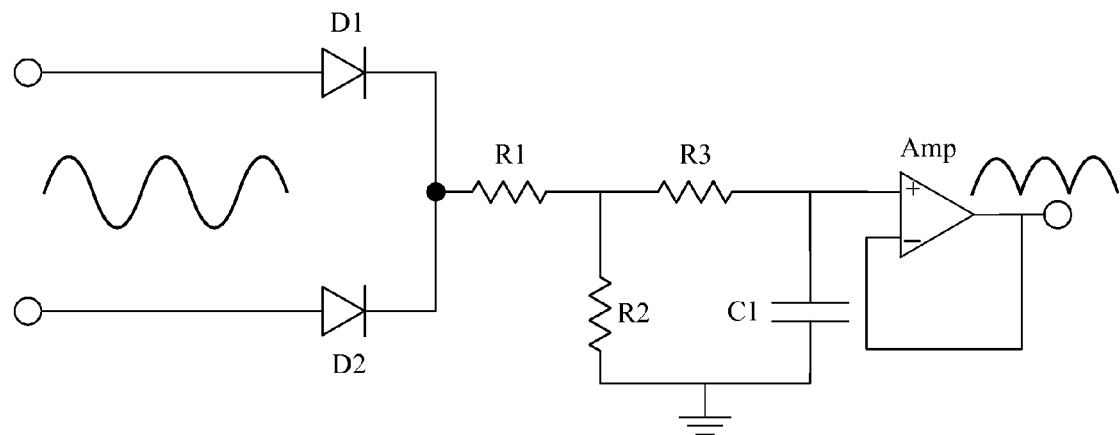
FIG. 2 illustrates another conventional sensing circuit for measuring an AC voltage. The sensing circuit of FIG. 2 is similar to the circuit of FIG. 1 with the addition of an amplifier.
Figure 3:
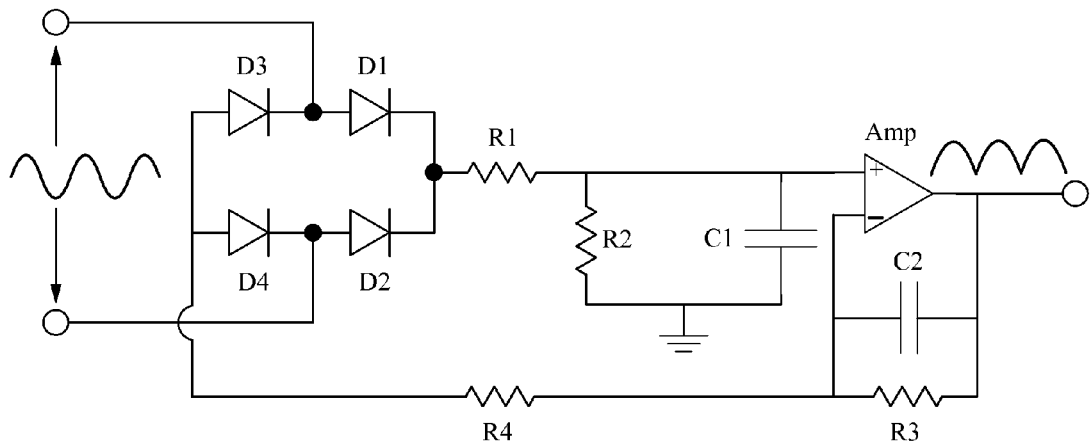
FIG. 3 illustrates yet another conventional sensing circuit for measuring an AC voltage.
Figure 4:
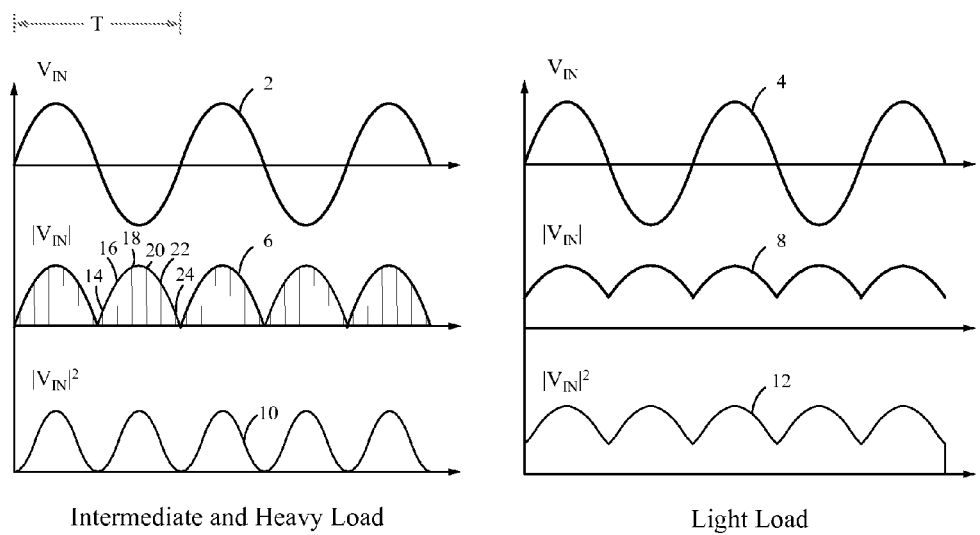
FIG. 4 illustrates exemplary voltage waveforms corresponding to the conventional sensing circuits.
Figure 5:
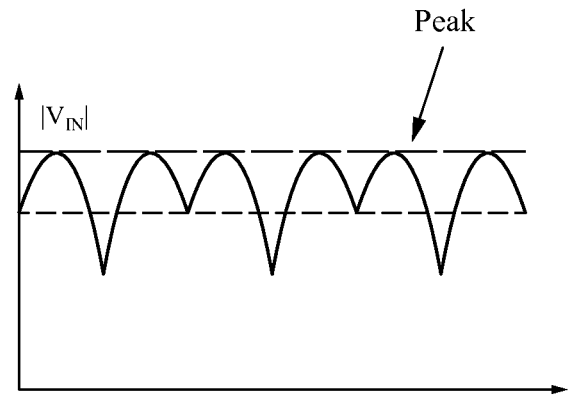
FIG. 5 illustrates an exemplary rectified waveforms |Vin| under light load conditions.
Figure 6:
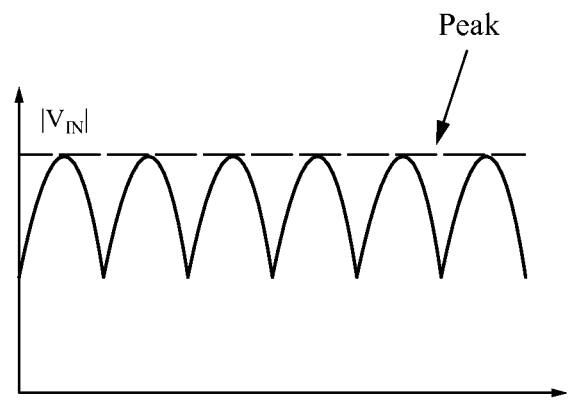
FIG. 6 illustrates another exemplary rectified waveforms |Vin| under light load conditions.

The RMS value is more accurately determined under light load conditions by first observing that the peak voltage of the rectified AC voltage signal is nearly identical for each cycle, despite the nature of the waveform distortion due to the light load conditions. FIG. 5 illustrates an exemplary rectified waveforms |Vin| under light load conditions. FIG. 6 illustrates another exemplary rectified waveforms |Vin| under light load conditions. In both cases, the rectified waveforms |Vin| are distorted due to the light load conditions. In FIG. 5, the low voltage value, or valley, for each cycle varies. In FIG. 6, the low voltage value for each cycle is consistent. In both waveforms, the low voltage value is significantly above zero. It is observed that the peak voltage value of the rectified waveform |Vin| corresponding to FIG. 5 is substantially the same from cycle to cycle. It is similarly observed that the peak voltage value of the rectified waveform |Vin| corresponding to FIG. 6 is substantially the same from cycle to cycle. Although the two waveforms of FIG. 5 and FIG. 6 are shown to have the same peak value, this is merely exemplary. The peak voltage value for one rectified waveform under light load conditions may be the same or different from the peak voltage value for another rectified waveform under light load conditions. In general, the distorted rectified waveforms shown in FIGS. 5 and 6 show examples of the general observation that the peak voltage value is substantially the same from cycle to cycle for a given rectified waveform, regardless of the waveform shape or offset from a full-wave rectified waveform.

Figure 7:
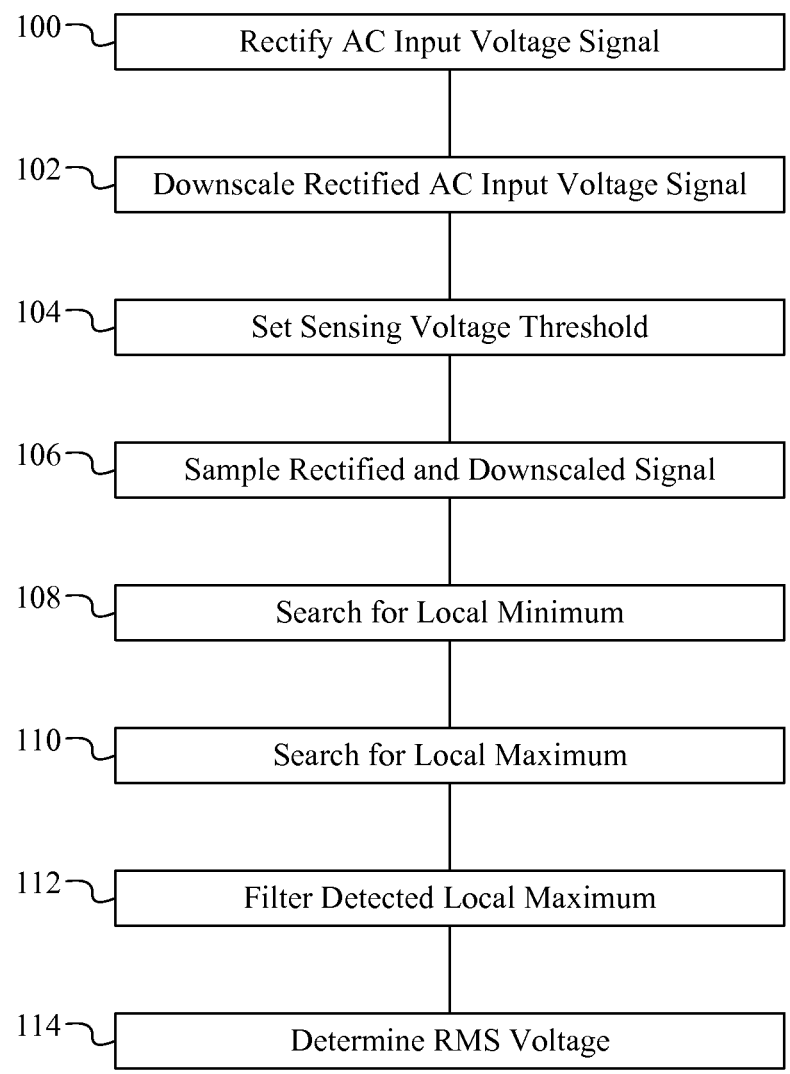
FIG. 7 illustrates an exemplary method of measuring an AC voltage according to an embodiment.

Using the observation that the peak voltage value is substantially the same from cycle to cycle for a given rectified waveform, a method of measuring an AC voltage is used to determine a more accurate RMS voltage value under light load conditions. FIG. 7 illustrates an exemplary method of measuring an AC voltage according to an embodiment. At the step 100, an AC voltage signal is rectified. At the step 102, the rectified AC voltage signal is downscaled by some downscaling factor in order to be sampled by an analog to digital converter embedded in a digital signal controller (DSC) or microcontroller (MCU), hereafter simply referred to as a DSC. The DSC operates within a limited voltage range, for example between 0V and 3.3V. In an exemplary application, the AC voltage is supplied as line voltage at 110V and having a line cycle frequency of 60 Hz. Downscaling the AC voltage can be performed using an conventional method including, but not limited to, a voltage divider. In those applications where the AC voltage signal already falls within the operating range of the DSC, then downscaling the AC voltage signal is not necessary.

Figure 8:
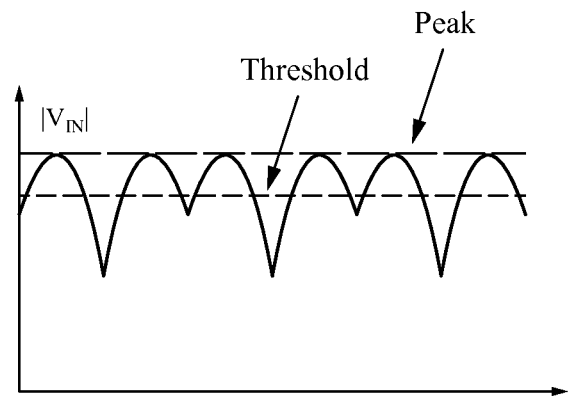
FIG. 8 illustrates an exemplary sensing voltage threshold value set in relation to the distorted rectified waveform |Vin| of FIG. 5.

At the step 104, a sensing voltage threshold is set. In general, the sensing voltage threshold value is set slightly higher than the low voltage value for each of all cycles. In other words, the sensing voltage threshold value is set higher than the lowest transit that would otherwise be a zero crossing of the rectified waveform had been fully rectified. FIG. 8 illustrates an exemplary sensing voltage threshold value set in relation to the distorted rectified waveform |Vin| of FIG. 5. FIG. 9 illustrates an exemplary sensing voltage threshold value set in relation to the distorted rectified waveform |Vin| of FIG. 6. In some embodiments, the sensing voltage threshold is set by passing the rectified AC input voltage signal |Vin| through a low-pass filter. The output of the low pass filter is a possible sensing voltage threshold value.

At the step 106, the rectified and downscaled signal is sampled according to a defined sampling rate.

Figure 10:
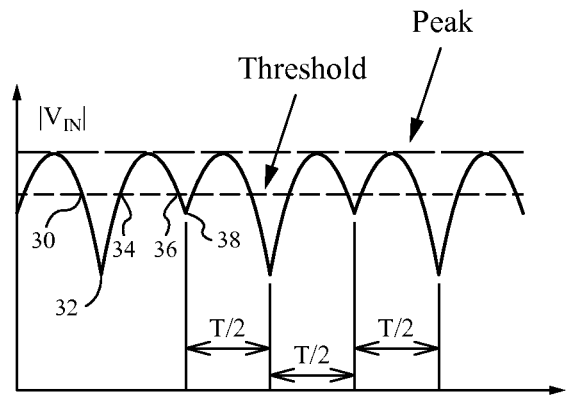
FIG. 10 illustrates an exemplary method of determining the local minimum as applied to the distorted rectified waveform |Vin| of FIG. 8.

At the step 108, a local minimum below the set sensing voltage threshold value is determined in each half line cycle T/2. To determine the local minimum, the sampled values are compared to the set sensing voltage threshold value. When a sampled value is equal to or less than the sensing voltage threshold value, the sampled values succeeding this comparison point are searched for the local minimum. In some embodiments, succeeding sampled values are compared to determine a transition from sampled values decreasing in value to sampled values increasing in value, which signifies a transition past the low voltage value within the half line cycle. FIG. 10 illustrates an exemplary method of determining the local minimum as applied to the distorted rectified waveform |Vin| of FIG. 8. The sampled values are compared to the sensing voltage threshold value until a sampled value is equal to or less than the sensing voltage threshold value, such as at point 30. The sampled values succeeding point 32 are searched for the local minimum, which is determined at point 32. Searching for the local minimum is discontinued when a sampled value exceeds the sensing voltage threshold value, such as at point 34. In some embodiments, succeeding sampled values are compared to determine a transition from sampled values decreasing in value to sampled values increasing in value, which signifies a transition past the low voltage value within the half line cycle. In other embodiments, all sampled values between trigger point 32 and 34 are searched for the lowest value, which is determined to be the local minimum.

Figure 11:
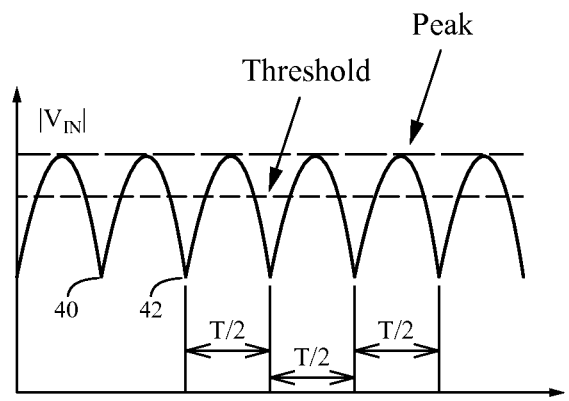
FIG. 11 illustrates determining the local minimum as applied to the distorted rectified waveform |Vin| of FIG. 9.

Searching for the subsequent local minimum corresponding to the next half line cycle begins once a sampled value is equal to or less than the sensing voltage threshold value, such as at point 36. As applied to the distorted rectified waveform in FIG. 10, the local minimum values in subsequent half-line cycles differ, such as the local minimum at point 32 and the local minimum at point 38. FIG. 11 illustrates determining the local minimum as applied to the distorted rectified waveform |Vin| of FIG. 9. As applied to the distorted rectified waveform in FIG. 11, the local minimum values in subsequent half-line cycles are substantially the same, such as the local minimum at point 40 and the local minimum at point 42.

Figure 12:
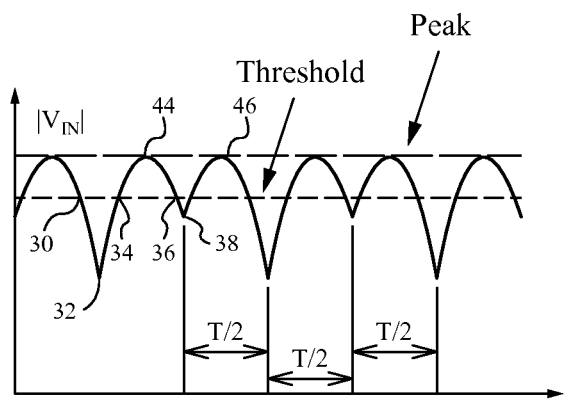
FIG. 12 illustrates an exemplary method of determining the local maximum as applied to the distorted rectified waveform |Vin| of FIG. 8.
Figure 13:
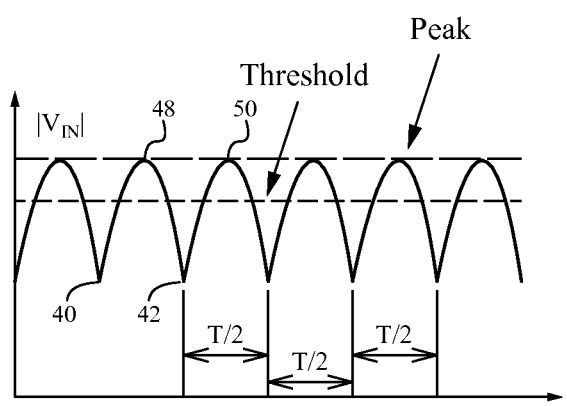

At the step 110, a local maximum is determined in each half line cycle T/2. Starting from the local minimum determined at the step 108, the sampled values succeeding the local minimum are searched for the local maximum. FIG. 12 illustrates an exemplary method of determining the local maximum as applied to the distorted rectified waveform |Vin| of FIG. 8. Starting from the local minimum at point 32, the sampled values are searched forward to determine the local maximum at point 44. Similarly, starting from the local minimum at point 38, the sampled values are searched forward to determine the local maximum at point 46. In some embodiments, succeeding sampled values starting from the local minimum are compared to determine a transition from sampled values increasing in value to sampled values decreasing in value, which signifies a transition past the peak value within the half line cycle. In other embodiments, all sampled values between the local minimum 32 and trigger point 36, or between trigger points 34 and 36, are searched for the highest value, which is determined to be the local maximum. FIG. 13 illustrates an exemplary method of determining the local maximum as applied to the distorted rectified waveform |Vin| of FIG. 9. Starting from the local minimum at point 40, the sampled values are searched forward to determine the local maximum at point 48. Similarly, starting from the local minimum at point 42, the sampled values are searched forward to determine the local maximum at point 50.

At the step 112, the local maximum detected at the step 110 is filtered for noise. In practice, there is a slight difference in detected local maximum values from one half line cycle to the next. This difference can be modeled as a stable local maximum value plus noise. The noise is filtered out of the detected local maximum value to determine the stable local maximum value. In some embodiments, the detected local maximum is filtered using a digital low-pass filter. FIG. 14 illustrates a conceptual procedure for filtering the detected local maximum according to an embodiment. The function $x(n)$ represents the detected local maximum value for a given cycle n. The function $H(z)$ represents the filtering function. The function $y(n)$ represents the filtered local maximum value for the given cycle n. The filtered local maximum value is also the stable local maximum value. In some embodiments, the filtered local maximum value $y(n)$ is represented by the equation:

$$y(n)=a^*y(n-1)+b^*x(n) \quad (1)$$

In some embodiments, equation (1) is implemented using the DSC or a MCU. The coefficients a and b are weighted values representative of the filtering characteristics, and as such are application specific values. The filtering function shown in equation (1) also functions as an averaging operation that includes the previous filtered local maximum value $y(n-1)$ and the current detected local maximum $x(n)$. Implementation of the filtering function results in an accurate estimation $y(n)$ of the real local maximum value. It is understood that the averaging operation can be performed over more than two cycles. It is also understood that alternative filtering functions can be used.

At the step 114, the filtered local maximum value determined at the step 112 is processed to determine the RMS voltage value. Since the original rectified AC voltage signal was downscaled at the step 102, the filtered local maximum value determined at the step 112 represents a scaled number, not an actual voltage value. As such, the scaled number $y(n)$ representing the filtered local maximum is converted to represent a real voltage scaled to the AC voltage. In some embodiments, a linear interpolation function is used. FIG. 15 illustrates a conceptual procedure for converting the filtered local maximum according to an embodiment. The function $y(n)$ represents the filtered local maximum value determined at the step 112. The function $L(z)$ represents a linear interpolation function. The function $z(n)$ represents the actual RMS voltage value for the given cycle n. In some embodiments, the actual RMS voltage value $z(n)$ is represented by the equation:

$$z(n)=c^*y(n)+d \quad (2)$$

In some embodiments, equation (2) is implemented using the DSC or a MCU. The coefficient c represents a scaling factor and the coefficient d represents an adjustment. The coefficient c is a multiple of two factors. A first factor is one over the scaling factor from the high voltage down to the voltage signal level performed in the step 102, which for example can be a gain of the voltage divider. The second factor is one over the square root of two, which represents the relationship between the peak voltage and the RMS voltage.

The determined actual RMS voltage value provides a more accurate measure under light load conditions than conventional sampling methods under similar conditions. Instead of relying upon sampled values from distorted voltage waveforms, the method determines a local maximum corresponding to a half line cycle peak and uses that value to calculate the actual RMS voltage value. In the method described above in relation to FIG. 7, the local maximum is determined by first determining a local minimum, and then searching forward from the local minimum to determine the local maximum. Alternatively, the local maximum can be determined without first determining the local minimum. In this alternative embodiment, the sensing voltage threshold may or may not be used to trigger a search for the local maximum. Although the local maximum can be determined without first finding the local minimum, the confidence of the method results is higher when the local minimum is first determined.

The method can be implemented in software, hardware, or some combination thereof. In an exemplary implementation, each of the steps described above is implemented in firmware. In such an implementation, appropriate processing circuitry and memory are utilized to implement the firmware solution. In another implementation, one, some, or all of the steps are implemented in hardware. Examples of such hardware implementations include, but are not limited to, rectifying circuitry, downscaling and upscaling circuitry, filters, processing circuitry such as digital signal processors, digital signal controllers and/or microcontrollers, comparators, and memory as required.

The present application has been described in terms of specific embodiments incorporating details to facilitate the understanding of the principles of construction and operation of the system and method. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of measuring an AC voltage signal under light load conditions, the method comprising:
 a. providing the AC voltage signal to a sensing circuit coupled to a load, wherein the sensing circuit comprises one or more diodes and the load operates under light load conditions;
 b. rectifying the AC voltage signal to form a rectified signal;
 c. sampling the rectified signal to obtain a set of sampled values within each half-cycle of the AC voltage signal;
 d. searching the sampled values within each half-cycle to determine a local minimum value within each half-cycle;
 e. searching the sampled values following the local minimum value to determine a local maximum value within each half-cycle; and
 f. calculating a root mean square value from the local maximum value within each half-cycle in order to determine the root mean square value within each half-cycle of the AC voltage signal.

2. The method of claim 1 further comprising:
 a. setting a sensing voltage threshold value;
 b. comparing the sampled values to the sensing voltage threshold value; and
 c. if one of the sampled value is equal to or less than the sensing voltage threshold value, then searching sampled values following the one sampled value to determine the local minimum value within each half-cycle.

3. The method of claim 2 wherein setting the sensing voltage threshold value comprises passing the rectified signal through a low-pass filter and setting the sensing voltage threshold value as an output of the filter.

4. The method of claim 1 further comprising scaling the rectified signal prior to sampling.

5. The method of claim 4 wherein calculating the root mean square value comprises re-scaling the local maximum value.

6. The method of claim 1 further comprising filtering the determined local maximum value for noise prior to calculating the root means square value.

7. The method of claim 6 wherein filtering the determined local maximum value comprises averaging the local maximum value of a current half-cycle with one or more filtered local maximum values from one or more preceding half-cycles.

8. The method of claim 6 wherein calculating the root mean square comprises applying a linear interpolation function to the filtered local maximum value.

9. The method of claim 1 wherein calculating the root mean square comprises applying a linear interpolation function to the local maximum value.

\* \* \* \* \*